(12) United States Patent
Lee et al.

(10) Patent No.: US 7,494,599 B2
(45) Date of Patent: Feb. 24, 2009

(54) METHOD FOR FABRICATING FINE PATTERN IN SEMICONDUCTOR DEVICE

(75) Inventors: Sung-Kwon Lee, Ichon-shi (KR); Seung-Chan Moon, Ichon-shi (KR); Won-Kyu Kim, Ichon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/742,288

(22) Filed: Apr. 30, 2007

(65) Prior Publication Data

US 2007/0259524 A1 Nov. 8, 2007

(30) Foreign Application Priority Data

May 2, 2006 (KR) .................. 10-2006-0039708

(51) Int. Cl.
*B44C 1/22* (2006.01)
(52) U.S. Cl. .................. 216/67; 216/72; 216/79; 438/725
(58) Field of Classification Search .................. 216/62, 216/67, 79, 72; 438/725
See application file for complete search history.

(56) References Cited

U.S. PATENT DOCUMENTS

| | | | |
|---|---|---|---|
| 6,475,904 B2 | 11/2002 | Okoroanyanwu et al. | |
| 6,573,030 B1 | 6/2003 | Fairbairn et al. | |
| 2001/0012689 A1 * | 8/2001 | Okoroanyanwu et al. | ... 438/637 |
| 2004/0229159 A1 * | 11/2004 | Kanagasabapathy et al. | ........ 430/270.1 |
| 2006/0068592 A1 * | 3/2006 | Dostalik | ........ 438/706 |

FOREIGN PATENT DOCUMENTS

| | | |
|---|---|---|
| KR | 10-2005-0058916 A | 6/2005 |
| KR | 10-2006-0019668 A | 3/2006 |

* cited by examiner

*Primary Examiner*—Binh X Tran
(74) *Attorney, Agent, or Firm*—Townsend and Townsend and Crew LLP

(57) ABSTRACT

A method for forming a fine pattern in a semiconductor device includes forming a first polymer layer over an etch target layer, the first polymer layer including a carbon-rich polymer layer, forming a second polymer layer over the first polymer layer, the second polymer layer including a silicon-rich polymer layer, patterning the second polymer layer, oxidizing surfaces of the patterned second polymer layer, etching the first polymer layer using the patterned second polymer layer comprising the oxidized surfaces, and etching the etch target layer using the patterned second polymer layer comprising the oxidized surfaces and the etched first polymer layer.

24 Claims, 8 Drawing Sheets

METHOD FOR FABRICATING FINE PATTERN IN SEMICONDUCTOR DEVICE

CROSS-REFERENCE TO RELATED APPLICATIONS

The present invention claims priority of Korean patent application number 10-2006-0039708, filed on May 2, 2006, which is incorporated by reference in its entirety.

BACKGROUND OF THE INVENTION

The present invention relates to a method for fabricating a semiconductor device, and more particularly, to a method for fabricating a fine pattern in a semiconductor device.

Amorphous carbon has been used as a part of a hard mask stack structure, where the hard mask has been used in patterning an N-channel metal-oxide semiconductor field effect transistor (NMOSFET) device when forming a fine pattern of 100 nm or below. The amorphous carbon allows easier patterning, and shows better selectivity than typical capping or protective materials of a silicon oxide ($SiO_2$) layer, silicon nitride ($Si_3N_4$) layer, and a silicon oxynitride (SiON) layer.

However, using amorphous carbon as a hard mask increases cost as compared to using a polysilicon layer as the hard mask, increasing the fabrication cost up to five to ten times. Furthermore, amorphous carbon shows deteriorated step coverage when formed over a peripheral region with large differences in heights, i.e., over various key boxes (align keys) used for monitoring photo and etch processes. Thus, a subsequent SiON layer may be formed unevenly. Consequently, when performing a rework process on a photoresist during a photo-exposure process, portions of the amorphous carbon may be lost, and undesired events (e.g., lifting and particle generation) may occur where the portions of the amorphous carbon are lost.

SUMMARY OF THE INVENTION

Embodiments of the present invention relate to a method for forming a fine pattern in a semiconductor device, which can improve a step coverage characteristic using a multiple-layer organic polymer hard mask which is formed using a spin on coating method. Also, the method can reduce deformation of a second polymer hard mask by performing an oxidation treatment on a surface of the second polymer hard mask in a plasma etch apparatus. This can be performed before or during a first polymer hard mask etch process using the second polymer hard mask.

In accordance with an aspect of the present invention, there is provided a method for forming a fine pattern in a semiconductor device, including: forming a first polymer layer over an etch target layer, the first polymer layer including a carbon-rich polymer layer; forming a second polymer layer over the first polymer layer, the second polymer layer including a silicon-rich polymer layer; patterning the second polymer layer; oxidizing surfaces of the patterned second polymer layer; etching the first polymer layer using the patterned second polymer layer comprising the oxidized surfaces; and etching the etch target layer using the patterned second polymer layer comprising the oxidized surfaces and the etched first polymer layer.

In accordance with another aspect of the present invention, there is provided a method for forming a fine pattern in a semiconductor device, including: forming a patterned first polymer layer over etch target layer, the patterned first polymer layer comprising a carbon-rich polymer layer; forming a patterned second polymer layer over the patterned first polymer layer, the patterned second polymer layer comprising an oxidized upper surface including silicon and oxygen; and etching the etch target layer using the patterned first and second polymer layers.

DESCRIPTION OF SPECIFIC EMBODIMENTS

The present invention relates to a method for fabricating a fine pattern in a semiconductor device. According to embodiments of the present invention, a carbon-rich first polymer layer and a silicon-rich second polymer layer are used as hard masks to improve a step coverage characteristic over a region with large height differences in a peripheral region. Furthermore, deformation of a second polymer hard mask may be prevented when etching a first polymer layer using a second polymer hard mask. This is done by performing an oxidation treatment on surfaces of the second polymer hard mask and then etching the first polymer layer. Thus, a desired fine pattern may be created with convenience.

Figure 1A:
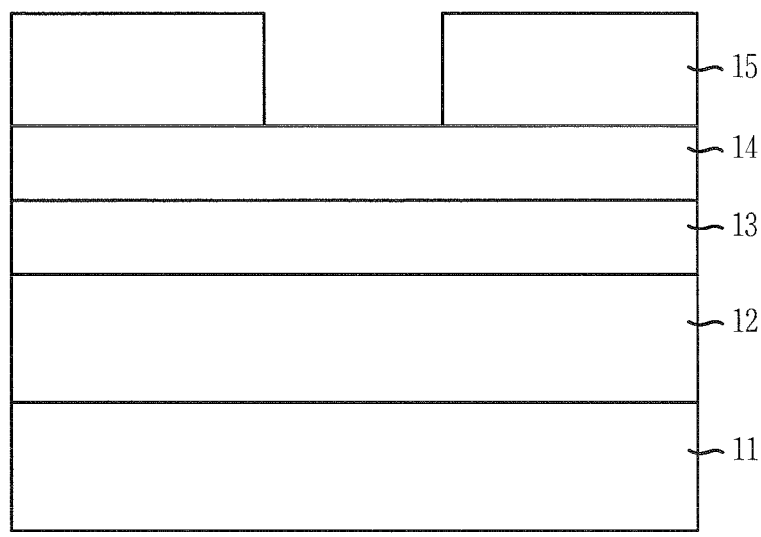
FIGS. 1A to 1E illustrate cross-sectional views of a method for forming a fine pattern in a semiconductor device in accordance with a first embodiment of the present invention.

Referring to FIG. 1A, in one embodiment of the present invention, an etch target layer 12 is formed over a substrate 11. The etch target layer 12 in this embodiment may include a semiconductive layer such as a conductive layer, an insulation layer, or a silicon layer. A first polymer layer 13 and a second polymer layer 14 are formed over the etch target layer 12 using a spin on coating method. The first polymer layer 13 may include a carbon-rich polymer layer and the second polymer layer 14 may include a silicon-rich polymer layer.

The second polymer layer 14 may be formed as a siloxane or silsesqioxane (SSQ) type, and may have a silicon content ranging from approximately 30% to approximately 45%. A photoresist pattern 15 is formed over certain portions of the second polymer layer 14.

Figure 1B:
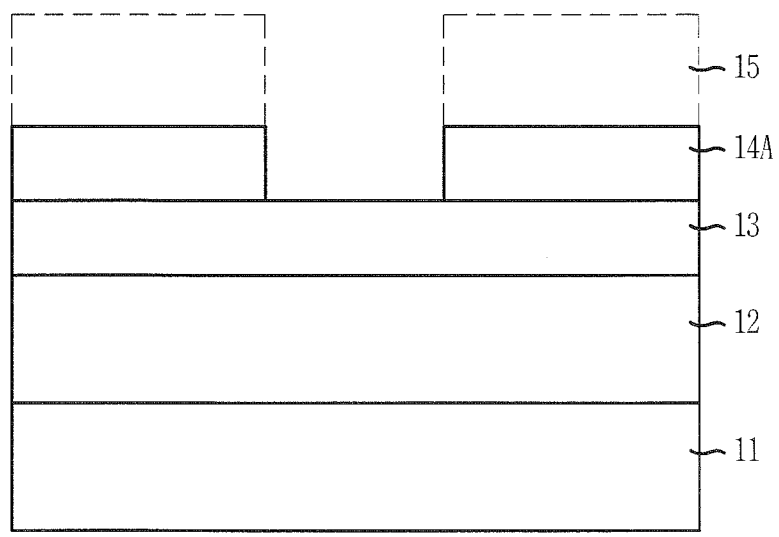

Referring to FIG. 1B, the second polymer layer 14 is etched using the photoresist pattern 15 as an etch barrier to form a second polymer hard mask 14A. Hereinafter, the etched second polymer layer 14 is referred to as the second polymer hard mask 14A.

The second polymer layer 14 is etched using a fluorine-based gas, e.g., an etch gas including tetrafluoromethane ($CF_4$) gas. The photoresist pattern 15 may be removed while the second polymer layer 14 is etched.

Figure 1C:
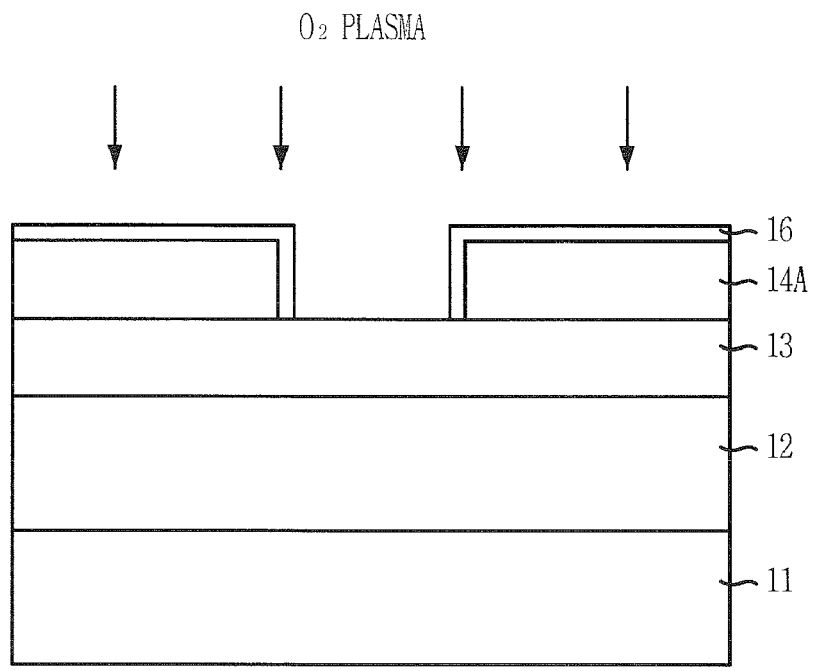

Referring to FIG. 1C, an oxygen ($O_2$) plasma treatment is performed to oxidize surfaces of the second polymer hard mask 14A. The $O_2$ plasma treatment is performed using a low power of approximately 500 W or less at a pressure of approximately 100 mT or greater. The surfaces of the second polymer hard mask 14A are oxidized through the $O_2$ plasma treatment to form $SiO_x$-based polymers 16. The $O_2$ plasma treatment is performed using low power at high pressure such that the surfaces of the second polymer hard mask 14A are oxidized while minimizing $O_2$ plasma damages on the substrate structure.

Figure 1D:
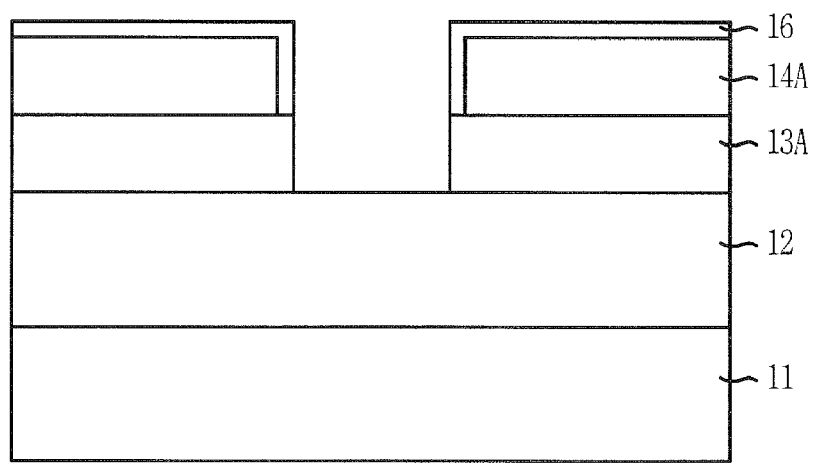

Referring to FIG. 1D, the first polymer layer 13 is etched using the second polymer hard mask 14A and the $SiO_x$-based polymers 16 as an etch barrier. The first polymer layer 13 is etched using an etch gas including nitrogen ($N_2$)/$O_2$ or $N_2$/hydrogen ($H_2$).

The deformation of the second polymer hard mask 14A by the etch gas used for etching the first polymer layer 13 may be prevented because the $SiO_x$-based polymers 16 are formed on the surfaces of the second polymer hard mask 14A. Thus, a desired line width may be maintained while etching the first polymer layer 13. Hereinafter, the etched first polymer layer 13 is referred to as a first polymer hard mask 13A.

Figure 1E:
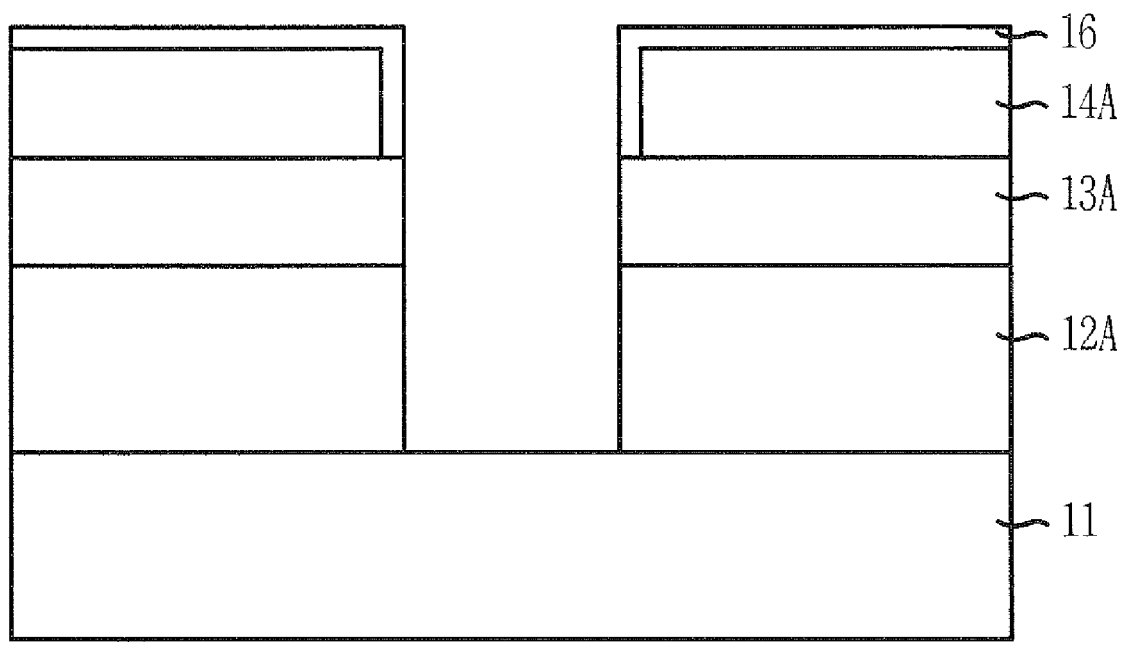

Referring to FIG. 1E, the etch target layer 12 is etched to form an etch target pattern 12A using the $SiO_x$-based polymers 16, the second polymer hard mask 14A, and the first polymer hard mask 13A as an etch barrier. Hereinafter, the etched etch target layer 12 is referred to as the etch target pattern 12A.

According to the first embodiment of the present invention, using the carbon-rich first polymer layer and the silicon-rich second polymer layer as the hard masks to etch the etch target layer may improve a step coverage characteristic over a region with large height differences.

The surfaces of the second polymer layer are oxidized by performing the $O_2$ plasma treatment after etching the second polymer layer, and the first polymer layer is then etched. Thus, the second polymer layer may not be deformed by the etch gas for etching the first polymer layer. Therefore, the etch target layer may be etched while maintaining the desired line width.

Figure 2A:
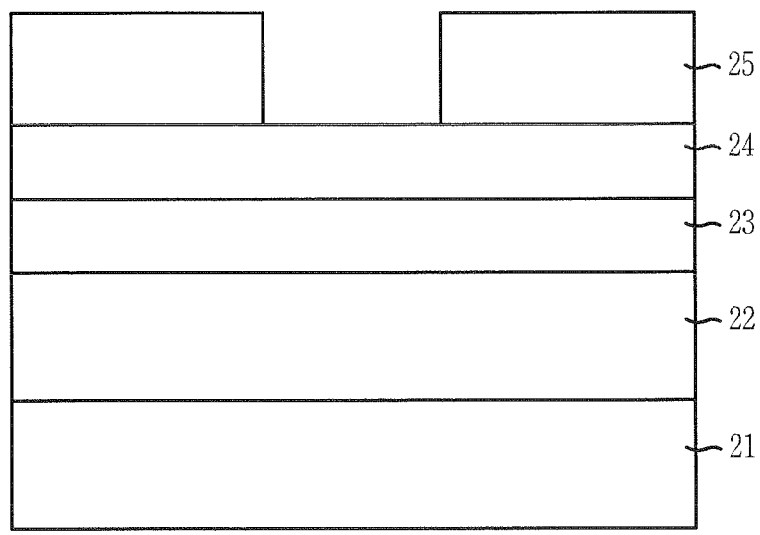
FIGS. 2A to 2E illustrate cross-sectional views of a method for forming a fine pattern in a semiconductor device in accordance with a second embodiment of the present invention.

Referring to FIG. 2A, in another embodiment of the present invention, an etch target layer 22 is formed over a substrate 21. The etch target layer 22 in this embodiment may include a semiconductive layer such as a conductive layer, an insulation layer, or a silicon layer. A first polymer layer 23 and a second polymer layer 24 are formed over the etch target layer 22 using a spin on coating method. The first polymer layer 23 may include a carbon-rich polymer layer and the second polymer layer 24 may include a silicon-rich polymer layer.

The second polymer layer 24 may be formed as a siloxane or silsesqioxane (SSQ) type, and may have a silicon content ranging from approximately 30% to approximately 45%. A photoresist pattern 25 is formed over certain portions of the second polymer layer 24.

Figure 2B:
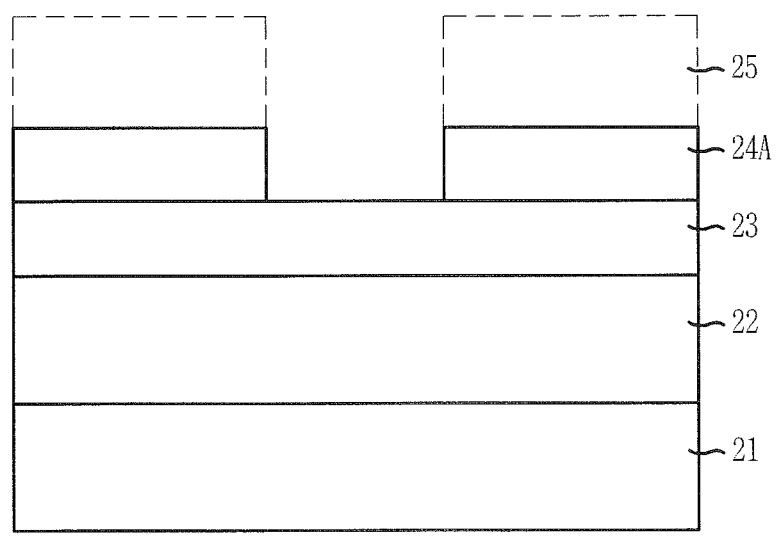

Referring to FIG. 2B, the second polymer layer 24 is etched using the photoresist pattern 25 as an etch barrier to form a second polymer hard mask 24A. Hereinafter, the etched second polymer layer 24 is referred to as the second polymer hard mask 24A.

The second polymer layer 24 is etched using a fluorine-based gas, e.g., an etch gas including tetrafluoromethane ($CF_4$) gas. The photoresist pattern 25 may be removed while the second polymer layer 24 is etched.

Figure 2C:
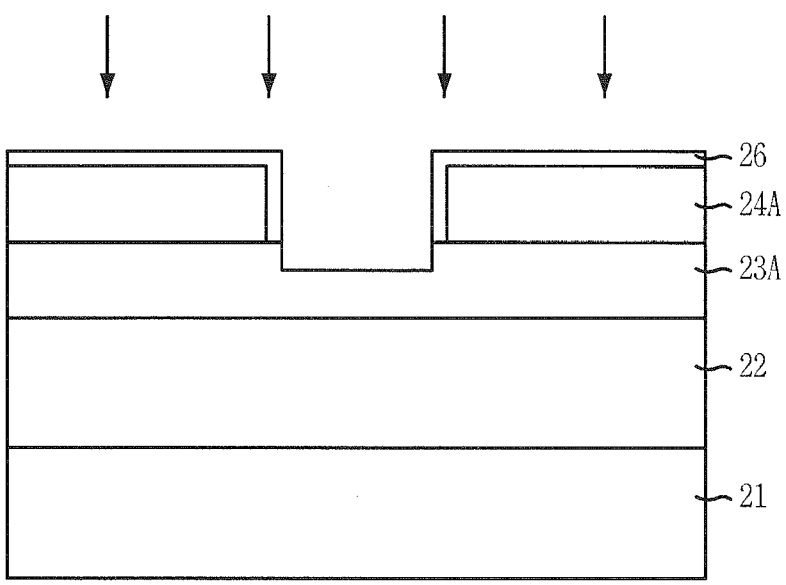

Referring to FIG. 2C, a portion of the first polymer layer 23 is etched using the second hard mask 24A as an etch barrier. The first polymer layer 23 may be etched using an etch gas including plasmas of nitrogen ($N_2$)/oxygen ($O_2$), $N_2$/$O_2$/methane ($CH_4$), or $N_2$/$O_2$/acetylene ($C_2H_2$). The first polymer layer 23 is etched under certain conditions to obtain a slow etch speed and a small etch depth. That is, the portion of the first polymer layer 23 is mainly etched at a high pressure in a low power atmosphere. For instance, the first polymer layer 23 is etched at a pressure ranging from approximately 100 mT to approximately 500 mT using a power ranging from approximately 10 W to approximately 500 W. Approximately ⅕ to approximately ⅘ of a total thickness of the first polymer layer 23 is etched under such conditions.

The $O_2$ plasma and the second polymer hard mask 24A react when the aforementioned etch gas is used at the relatively high pressure and the low power atmosphere when compared to subsequent etch processes. Thus, the first polymer layer 23 is etched and the second polymer hard mask 24A is oxidized at substantially the same time. $SiO_x$-based polymers 26 are formed on surfaces of the second polymer hard mask 24A. After etching the portion of the first polymer layer 23, the first polymer layer 23 is referred to as a remaining first polymer layer 23A.

Figure 2D:
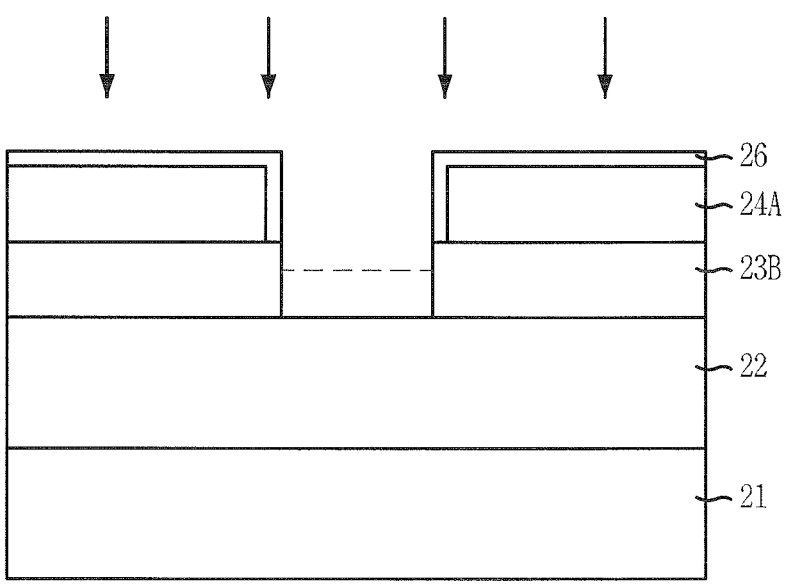

Referring to FIG. 2D, the remaining first polymer layer 23A is further etched to expose a surface of the etch target layer 22 using the $SiO_x$-based polymers 26 and the second polymer hard mask 24A. At this time, the remaining first polymer layer 23A is etched using $N_2$/hydrogen ($H_2$) plasma. The remaining first polymer layer 23A is etched at a relatively low pressure and a high power atmosphere when compared to the conditions shown in FIG. 2C to obtain a fast etch speed and to reduce damages. For instance, the remaining first polymer layer 23A is etched at a pressure ranging from approximately 10 mT to approximately 100 mT using a power ranging from approximately 500 W to approximately 1,000 W.

At this time, the second polymer hard mask 24A may not be damaged by the $N_2$/$H_2$ plasma because the $SiO_x$-based polymers 26 are formed on the surfaces of the second polymer hard mask 24A. That is, the $SiO_x$-based polymers 26 function to reduce damages on the second polymer hard mask 24A caused by the $N_2$/$H_2$ plasma. Thus, the remaining first polymer layer 23A may be etched to form a first polymer hard mask 23B without deforming the second polymer hard mask 24A. Hereinafter, the etched remaining first polymer layer 23A is referred to as the first polymer hard mask 23B.

Figure 2E:
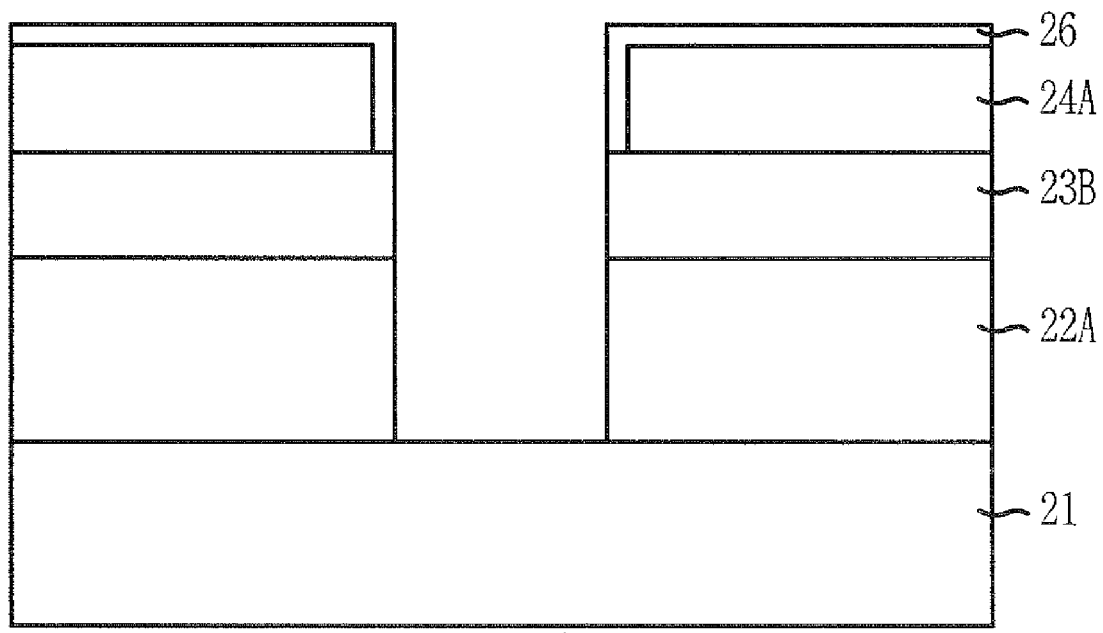

Referring to FIG. 2E, the etch target layer 22 is etched to form an etch target pattern 22A using the $SiO_x$-based polymers 26, the second polymer hard mask 24A, and the first polymer hard mask 23B as an etch barrier. Hereinafter, the etched etch barrier layer 22 is referred to as the etch target pattern 22A.

Figure 3A:
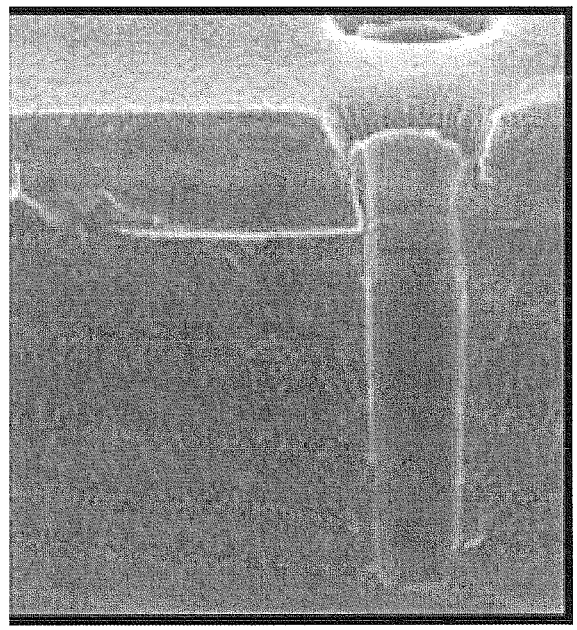
FIGS. 3A to 3C illustrate micrographic views of different stages of a substrate structure shown in the second embodiment of the present invention.

Referring to the micrograph in FIG. 3A, $O_2$ plasma and a second polymer hard mask react when an etch gas including plasmas of $N_2$/$O_2$, $N_2$/$O_2$/$CH_4$, or $N_2$/$O_2$/$C_2H_2$ is used at a high pressure and a low power atmosphere. Thus, a first polymer layer is etched and the second polymer hard mask is oxidized at substantially the same time. $SiO_x$-based polymers are formed on surfaces of the second polymer hard mask.

Figure 3B:
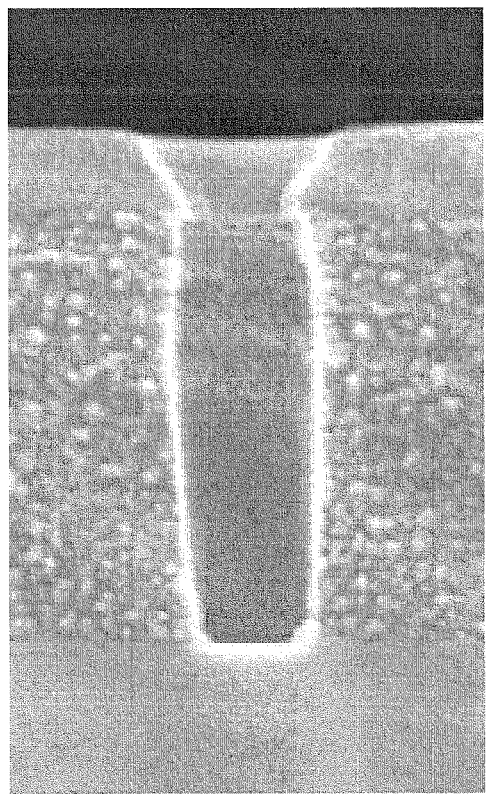

Referring to the micrograph in FIG. 3B, the $SiO_x$-based polymers function to reduce damages on the second polymer hard mask caused by $N_2$/$H_2$ plasma. Thus, the remaining first polymer layer may be etched to form a first polymer hard mask without deforming the second polymer hard mask.

Figure 3C:
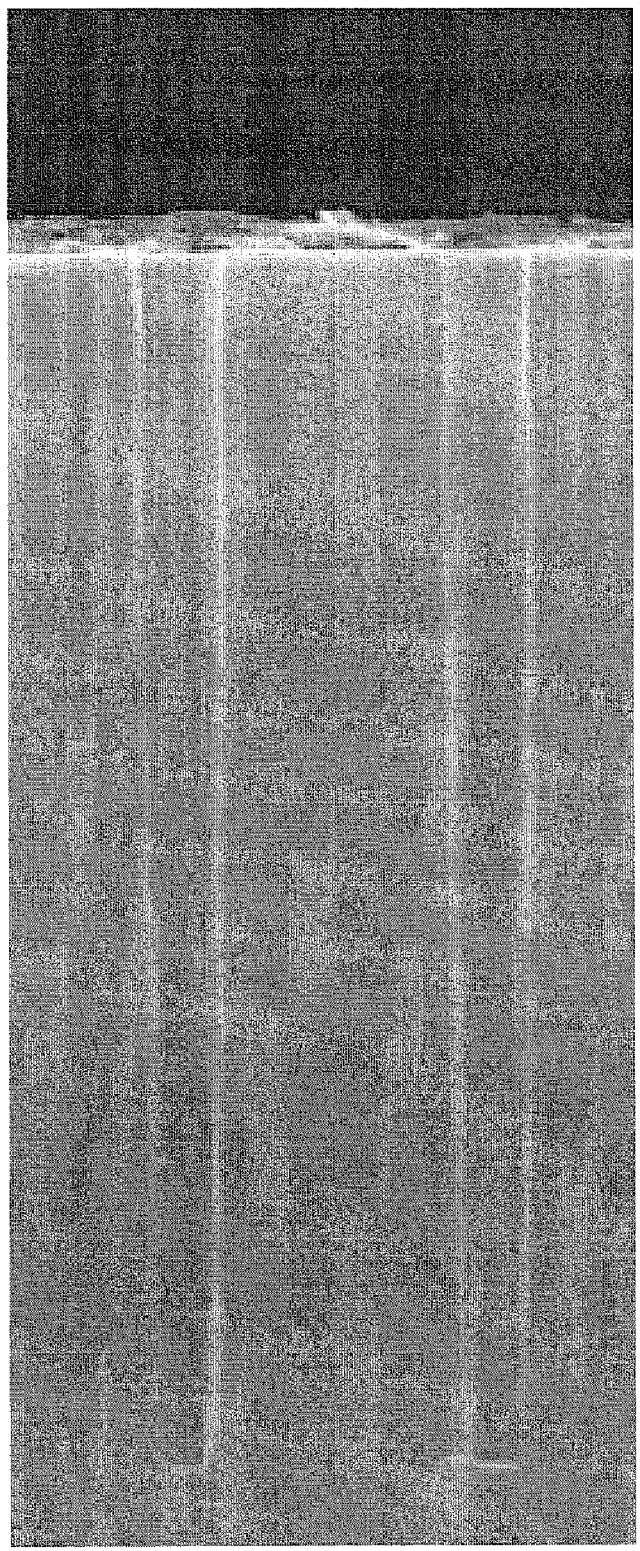

Referring to the micrograph in FIG. 3C, an etch target layer is etched to form an etch target pattern using the $SiO_x$-based polymers, the second polymer hard mask, and the first polymer hard mask as an etch barrier.

According to the second embodiment of the present invention, a portion of the first polymer layer is etched using an etch gas including $O_2$ plasma after the second polymer hard mask is formed. At this time, the $SiO_x$-based polymers are formed on the surfaces of the second polymer hard mask while the portion of the first polymer layer is being etched. The remaining first polymer layer is etched using the $SiO_x$-based polymers and the second polymer hard mask. Damage to the second polymer hard mask by the etch gas for etching the remaining first polymer layer may be prevented because the $SiO_x$-based polymers are formed on the surfaces of the second polymer hard mask. Thus, a fine pattern may be formed while maintaining a desired line width.

While the present invention has been described with respect to the specific embodiments, it will be apparent to those skilled in the art that various changes and modifications may be made without departing from the spirit and scope of the invention as defined in the following claims.

What is claimed is:

1. A method for forming a fine pattern in a semiconductor device, the method comprising:
    forming a first polymer layer over an etch target layer, the first polymer layer including carbon;
    forming a second polymer layer over the first polymer layer, the second polymer layer including silicon;
    patterning the second polymer layer to have a first opening having a first width;
    oxidizing surfaces of the patterned second polymer layer;
    etching the first polymer layer using the patterned second polymer layer comprising the oxidized surfaces as a hard mask, the etched first polymer layer having a second opening having a second width, the second width being substantially the same as the first width; and
    etching the etch target layer using the patterned second polymer layer comprising the oxidized surfaces and the etched first polymer layer as a hard mask to define a third opening having a third width, the first, second, and third widths being substantially the same.

2. The method of claim 1, wherein etching the first polymer layer using the patterned second polymer layer comprising the oxidized surfaces comprises using nitrogen ($N_2$)/$O_2$ gas, $N_2$/hydrogen ($H_2$) gas, or both.

3. The method of claim 1, wherein the etch target layer comprises one selected from the group consisting of a conductive layer, an insulation layer, and a semiconductor substrate.

4. The method of claim 1, wherein oxidizing the surfaces of the patterned second polymer layer comprises performing an oxygen ($O_2$) plasma treatment on the second polymer layer.

5. The method of claim 4, wherein oxidizing the surfaces of the patterned second polymer layer comprises forming silicon-oxide-based polymers over the surfaces of the patterned second polymer layer.

6. The method of claim 4, wherein the $O_2$ plasma treatment comprises using a pressure of approximately 100 mT or greater and a power of approximately 500 W or less.

7. The method of claim 1, wherein patterning the second polymer layer comprises:
    forming a photoresist pattern over the second polymer layer; and
    etching the second polymer layer using a fluorine-based gas.

8. The method of claim 7, wherein the fluorine-based gas comprises tetrafluoromethane ($CF_4$) gas.

9. The method of claim 1, wherein the first polymer layer and the second polymer layer are formed using a spin-on coating method.

10. The method of claim 9, wherein the second polymer layer is formed as a siloxane type or a silsesquioxane (SSQ) type and comprises a silicon content.

11. A method for forming a fine pattern in a semiconductor device, comprising:
    forming a patterned first polymer layer over etch target layer, the patterned first polymer layer comprising carbon and defining a first opening having a first width;
    forming a patterned second polymer layer over the patterned first polymer layer, the patterned second polymer layer comprising an oxidized upper surface including silicon and oxygen, the patterned second polymer layer defining a second opening and a second width, the first and second widths being substantially the same; and
    etching the etch target layer using the patterned first and second polymer layers as a hard mask to define a third opening having a third width, the first, second, and third widths being substantially the same.

12. The method of claim 11, wherein the upper surface of the patterned second polymer layer includes silicon-oxygen polymer.

13. The method of claim 11, wherein the patterned second polymer layer is formed as a siloxane type or a silsesqioxane (SSQ) type and comprises a silicon content.

14. The method of claim 11, wherein the etch target layer comprises one selected from the group consisting of a conductive layer, an insulation layer, and a semiconductor substrate.

15. The method of claim 11, wherein forming the patterned second polymer layer comprises:
    patterning a second polymer layer to define the second opening exposing a portion of a first polymer layer; and
    etching the exposed portion of the first polymer layer using the patterned second polymer layer as a hard mask to define the first opening.

16. The method of claim 15, wherein the exposed portion of the first polymer layer is etched using a first etch method while the patterned second polymer layer is being oxidized, thereby providing the oxidized upper surface of the second polymer layer.

17. The method of claim 15, further comprising etching a remaining-first polymer layer using the patterned second polymer layer comprising the oxidized upper surface as a hard mask, the remaining first polymer layer being etched using a second etch method.

18. The method of claim 17, wherein the first etch method is performed in a first pressure level and a first power level, and the second etch method is performed in a second pressure level and a second power level, and
    wherein the first pressure level is higher than the second pressure level, and the first power level is lower than the second power level.

19. The method of claim 18, wherein the first pressure level and the first power level comprise a pressure ranging from approximately 100 mT to approximately 500 mT and a power ranging from approximately 10 W to approximately 500 W, respectively.

20. The method of claim 18, wherein the remaining first polymer layer is etched in the fir4 second pressure level between approximately 10 mT and approximately 100 mT and the first second power level ranging between approximately 500 W and approximately 1,000 W.

21. The method of claim 11, wherein the second opening of the patterned second polymer layer exposes a portion of the first polymer layer, and wherein forming the patterned first polymer layer comprises:
    etching the exposed portion of the first polymer layer using a first etch method and the patterned second polymer layer as an etch mask, wherein an upper surface of the patterned second polymer layer being oxidized during the first etch method; and
    etching a remaining first polymer layer using a second etch method and the patterned second polymer layer comprising the oxidized upper surface;
    wherein the first etch method uses a plasma including nitrogen and oxygen; or $N_2$, $O_2$ and methane ($CH_4$); or $N_2$, $O_2$, and acetylene ($C_2H_2$).

22. The method of claim 21, wherein the second polymer layer is patterned by performing a process including:
   forming a photoresist pattern over the second polymer layer; and
   etching the second polymer layer using a fluorine-based gas.

23. The method of claim 22, wherein the fluorine-based gas comprises tetrafluoromethane ($CF_4$) gas.

24. A method for forming a fine pattern in a semiconductor device, comprising:
   forming a patterned first polymer layer over etch target layer, the patterned first polymer layer comprising carbon;
   forming a patterned second polymer layer over the patterned first polymer layer, the patterned second polymer layer comprising an oxidized upper surface including silicon and oxygen; and
   etching the etch target layer using the patterned first and second polymer layers as a hard mask, wherein forming the patterned second polymer layer comprises:
   patterning a second polymer layer to define an opening exposing a portion of a first polymer layer,
   etching the exposed portion of the first polymer layer using the patterned second polymer layer, and
   etching a remaining-first polymer layer using the patterned second polymer layer comprising the oxidized upper surface as a hard mask.

* * * * *